United States Patent [19]

Hagiwara et al.

[11] Patent Number: 4,721,878

[45] Date of Patent: Jan. 26, 1988

[54] CHARGED PARTICLE EMISSION SOURCE STRUCTURE

[75] Inventors: Hirotoshi Hagiwara; Akio Rokugawa; Naoyuki Okamoto, all of Machida; Tsunemasa Inoue, Atsugi, all of Japan

[73] Assignee: Denki Kagaku Kogyo Kabushiki Kaisha, Tokyo, Japan

[21] Appl. No.: 870,530

[22] Filed: Jun. 4, 1986

[30] Foreign Application Priority Data

Jun. 4, 1985 [JP] Japan ............................ 60-119777
Dec. 14, 1985 [JP] Japan ............................ 60-281767

[51] Int. Cl.$^4$ ........................... H01J 1/30; H05H 1/00
[52] U.S. Cl. .................................... 313/362.1; 313/336
[58] Field of Search .................. 313/362.1, 336, 232; 315/111.81

[56] References Cited

U.S. PATENT DOCUMENTS

| | | | |
|---|---|---|---|
| 3,814,975 | 6/1974 | Wolfe et al. | 313/336 |
| 4,088,919 | 5/1978 | Clampitt et al. | 313/336 |
| 4,467,240 | 8/1984 | Futamoto et al. | 313/336 |
| 4,482,839 | 11/1984 | Wada et al. | 313/336 X |
| 4,488,045 | 12/1984 | Anazawa et al. | 313/362.1 X |

FOREIGN PATENT DOCUMENTS 114257 9/1981 Japan .
35829 3/1983 Japan .
101750 6/1984 Japan .

Primary Examiner—Palmer C. DeMeo
Attorney, Agent, or Firm—Oblon, Fisher, Spivak, McClelland & Maier

[57] ABSTRACT

A charged particle emission source structure comprising a needle-like electrode for emission of charged particles, a reservoir for a liquid metal for wetting the surface of the needle-like electrode, heat-generating support members for heating the liquid metal and holding the reservoir or the needle-like electrode, and an extraction electrode for applying an electric field as between it and the needle-like electrode, which is characterized in that conductive partitions hardly wettable with the liquid metal are provided between the heat-generating support members and the reservoir or the needle-like electrode.

20 Claims, 5 Drawing Figures

CHARGED PARTICLE EMISSION SOURCE STRUCTURE

FIELD OF THE INVENTION

The present invention relates to a charged particle emission source structure of the type wherein a needle-like electrode is wetted with a molten metal and a high electric field is applied to the tip of the needle-like electrode to emit an ion beam or an electron beam.

BACKGROUND OF THE INVENTION

An ion beam by means of a liquid metal is expected to be very useful, since it makes fine work to a level of nanometers possible, while the fine work by conventional electron beam exposure has a limit at a level of submicrons. Further, the ion beam is applicable to mask-less ion implantation, milling or X-ray mask repairs.

On the other hand, a field emission electron beam or a thermal field emission electron beam is expected to be useful as an electron source for a low acceleration SEM used for e.g. observation of minute portions of semiconductor devices.

Heretofore, various structures have been proposed for liquid metal ion sources.

For instance, (1) an electric field evaporation type ion source structure has been proposed wherein a hair pin type heater is used in which a needle-like electrode is secured to a bent portion of the heater (Japanese Unexamined Patent Publication No. 114257/1981). However, in this structure, the hair pin type heater undergoes a thermal deformation, when heated, whereby the position of the needle-like electrode changes, and a stable ion beam is hardly obtainable.

As an improvement, (2) a structure has been proposed in which a reservoir for a metal to be ionized is supported by a conductive support member. More specifically, this liquid metal ion source structure comprises a reservoir for a metal to be ionized, a needle-like electrode having a needle-like tip to which a liquid metal is supplied from the reservoir, a means for applying a strong electric field to the needle-like tip, and a heat-generating support member thermally connected to the reservoir or to the needle-like electrode and being capable of generating a heat when electrically energized, the supporting member being formed by a material having a poor affinity with the liquid metal (Japanese Unexamined Patent Publication No. 35829/1983).

Further, (3) a structure wherein, an electrode extends through the center of a plate-like heat-generating member, and the above-mentioned material is attached around the extending-through portion (Japanese Unexamined Patent Publication No. 101750/1984).

However, these methods have a drawback that even when the heat-generating member is made of a material hardly wettable with the substance to be ionized, such a substance tends to overflow from the reservoir or from the needle-like electrode as ions are continuously emitted by conducting an electric current, and the surface of the heat-generating member will be wetted by the substance, whereby the electric resistance of the member tends to be low, and it eventually becomes difficult to conduct heating, thus adversely affecting the quantity of the ion beam emission.

Further, the needle-like electrode is made of a material having a high melting point and being usually brittle, and it was difficult to bond the reservoir or the heater by a conventional simple method such as spot welding. As shown in Japanese Unexamined Patent Publication No. 132632/1982 (corresponding to U.S. Pat. No. 4,467,240), in a structure wherein a needle-like electrode is secured to a carbon heater, no practical reservoir exists, and an evaporation loss of the substance to be ionized is substantial, whereby the life of the ion source is short.

On the other hand, in the conventional field emission electron source or thermal field emission electron source, it is common that the tip of single crystal tungsten is shaped into a needle-like shape by electropolishing, and an electric field is applied to the tip to obtain electron emission. The field emission electron source is required to be under a highly vacuumed condition at a level of not higher than $10^{-10}$ torr, and a high level of technique is required to maintain the highly vacuumed condition. However, conventional electron source structures have a drawback that it is impossible to maintain an electron beam in a stabilized condition unless a flushing operation by heating the needle-like electrode at a high temperature is conducted from time to time.

For a thermal field emission electron source, it is known that a needle-like electrode tip made of a tungsten single crystal having a <100> orientation and covered with metal zirconium, followed by heat treatment in the presence of a very small amount of oxygen to have the work function of the (100) plane reduced from 4.5 eV to 2.5 eV (U.S. Pat. No. 3,814,975). However, this method has a drawback that a complicated operation is required for the activating treatment to reduce the work function of the tip.

OBJECT OF THE INVENTION

It is an object of the present invention to provide a charged particle emission source structure which presents excellent stability in the emission of charged particles and which is capable of being used for a long period of time without requiring complicated treatment for activation.

SUMMARY OF THE INVENTION

The present inventors have conducted extensive researches to accomplish the above object, and as a result, have found that by providing a conductive partition hardly wettable with the liquid metal between the heat-generating support member and the reservoir or the needle-like electrode, it is possible to prevent the transfer of the liquid metal flowing from the reservoir or from the needle-like electrode to the heat-generating support member, and the change in the electric resistance of the heat-generating support member can be avoided, whereby the emission of charged particles is stabilized. Further, by using a needle-like electrode with its tip covered with the liquid metal, the needle-like electrode tip is always refreshed with fresh metal by the flow of the liquid metal, whereby the activated condition can be maintained for a long period of time without conducting the activating treatment of the needle-like electrode tip in the thermal field emission electron source. Further, also in the field emission type electron source, the metal on the surface of the needle-like electrode is melted by instantaneously heating the electrode, whereby the metal on the surface of the needle-like electrode tip is refreshed, and thus the activating treatment can readily be conducted. The present invention has been accomplished on the basis of these discoveries.

DESCRIPTION OF THE INVENTION

The present invention provides a charged particle emission source structure comprising a needle-like electrode for emission of charged particles, a reservoir for a liquid metal for wetting the surface of the needle-like electrode, a heat-generating support member for heating the liquid metal and holding the reservoir or the needle-like electrode, and an extraction electrode for applying an electric field as between it and the needle-like electrode, which is characterized in that a conductive partition hardly wettable with the liquid metal is provided between the heat-generating support member and the reservoir or the needle-like electrode.

DESCRIPTION OF THE INVENTION

Now, the charged particle emission source structure of the present invention will be described in detail with reference to the drawings.

FIG. 1 is a cross-sectional view of an embodiment of the charged particle emission source structure of the present invention.

FIG. 2 is a perspective view of the main portion of the embodiment.

FIG. 3 is a cross-sectional view of the liquid metal ion source structure in Example 6.

FIG. 4 is a cross-sectional view of the liquid metal ion source structure of Example 7.

FIG. 5 is a perspective view of the main portion of the liquid metal ion source structure of Comparative Example 2.

Figure 1:
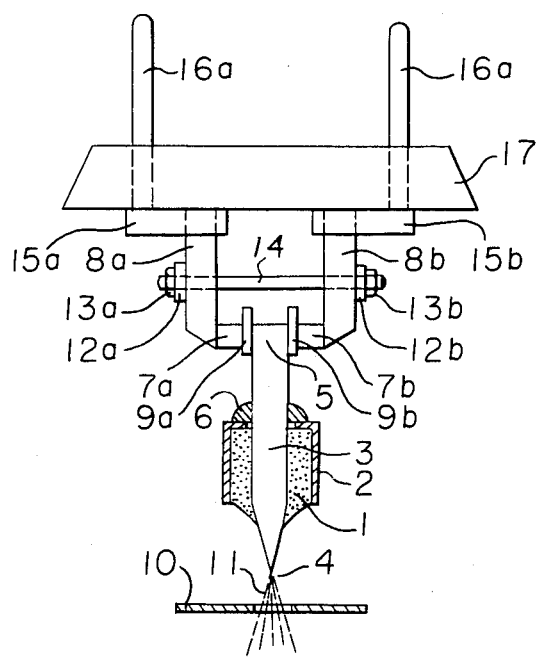
Referring to FIGS. 1 and 2, a liquid metal 1 stored in a reservoir 2 flows on the surface of a needle-like electrode 3 and wets the needle-like electrode tip 4. Heat-generating support members 7a and 7b support the base portion 5 of the needle-like electrode with partitions 9a and 9b interposed between the support members and the base portion. Further, the heat-generating support members 7a and 7b serve to keep the liquid metal in a liquid state by the heat generation. The bond portion 6 joins the reservoir and the needle-like electrode, and at the same time, prevents the liquid metal from flowing from the reservoir to the base portion of the needle-like electrode.
Figure 2:
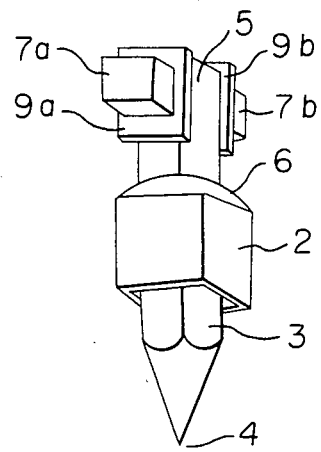

Conductive support members 8a and 8b support the heat-generating support members and at the same time conduct an electric current for heating. The conductive support members 8a and 8b are connected by a tierod 14, but they are electrically insulated by insulators 12a and 12b. The supporting force of the heat-generating support members is adjusted by nuts 13a and 13b.

A heating power source is supplied from electrode terminals 16a and 16b and conducted to the conductive support members via connecting members 15a and 15b. The insulating substrate 17 provides electric insulation and serves to fix the entire structure.

When the above structure is to be used as a liquid metal ion source, a metal desired to be used as the ion source is put in the reservoir, and the heat-generating support member is electrically heated to melt the metal in the reservoir and to permit the molten or liquid metal to reach the needle-like electrode tip. An electric potential lower than the potential of the needle-like electrode is applied to the extraction electrode 10, whereby a ion beam 11 is emitted.

When the above-mentioned structure is to be used as a field emission electron source, a metal for reducing the work function of the needle-like electrode tip is put in the reservoir, and the heat-generating support member is electrically heated to melt the metal in the reservoir and to permit the liquid metal to reach the needle-like electrode tip. Then, heating is stopped to bring the temperature of the needle-like electrode to a level of room temperature. An electric potential higher than the potential of the needle-like electrode is applied to the extraction electrode 10, whereby an electron beam 11 is emitted.

When the above-mentioned structure is to be used as a thermal field emission electron source, firstly the liquid metal is permitted to reach the needle-like electrode tip in the same manner as in the case of the above-mentioned field emission electron source. Then, the heating current is adjusted to bring the temperature of the needle-like electrode to a predetermined high temperature level. An electric potential higher than the potential of the needle-like electrode is applied to the extraction electrode 10, whereby an electron beam 11 is emitted.

DESCRIPTION OF THE PREFERRED EMBODIMENTS OF THE INVENTION

The liquid metal used for the above-mentioned field emission electron source or thermal field emission electron source, is required not only to have a low work function, but also to be hardly reactive with the needle-like electrode. As such a metal, a single substance metal such as Ga, In, Cs, Sr or Ce, or an alloy such as Au-Si or Ga-Au, is suitable.

Now, the main parts of the charged particle emission source structure of the present invention will be described.

In the case of a conventional Ga metal ion source, the needle-like electrode is made of a tungsten wire with its forward end sharpened by electropolishing. In this case, the melting point of Ga is as low as 30° C., an ion beam can be generated at a temperature of from 100° to 200° C. Accordingly, no reaction of the tungsten needle-like electrode with Ga takes place, and there is no particular problem.

Whereas, in the case where the metal to be melted is B, As, P, Si or Be, the melting point is high and the reactivity is high. Therefore, if a tungsten needle-like electrode is used, a reaction takes place in a few seconds in an extreme case, whereby it is hardly possible to obtain a stabilized ion beam. This phenomenon is particularly remarkable in the case of an alloy containing B. Other properties required for the needle-like electrode include (1) good wettability with the liquid metal, (2) a high density, and no inclusion of air bubbles or defects in the tip, (3) high mechanical strength so that the tip will not be broken by a thermal or electrical shock, (4) electric conductivity, and (5) non-reactivity with the reservoir and the heater.

The present inventors have made a study for a material for the needle-like electrode which is hardly reactive and which has good wettability with a metal containing boron, and have found that a shaped product made of a carbide or boride of at least on element selected from the group consisting of chromium, molybdenum and tungsten is particularly suitable.

The material for the needle-like electrode will be described in further detail.

A boron-containing alloy here is meant for a low melting point alloy containing boron such as Ni-B, Ni-Pd-B, Pt-B, Au-Si-B or Ni-Au-Si-B, which may further contain other single substances such as In, As and P.

The needle-like electrode may be made of a carbide or boride of at least one element selected from the group consisting of Cr, Mo and W. The carbide includes $Cr_3C_2$ and $Mo_2C$ as well as CrC, MoC and WC. The ratio of the metal element to carbon may be regular as in the case of a proportional compound or may be irregular as in the case of a disproportional compound. Further, it may be a solid solution or a mixed crystal of the above-mentioned compounds. Likewise, the boride includes CrB, $CrB_2$, $MoB_2$, $Mo_2B_5$ and $W_2B_5$. The ratio of the metal element to boron may be stoichiometry or not. It may be a solid solution or a mixed crystal of the above compounds. The needle-like electrode may be prepared by cutting (a) a sintered body obtained by molding the material if necessary together with a small amount of Fe, Ni or Co as a binder under a pressure of at least 100 kg/cm$^2$, followed by sintering at a temperature of from 1600° to 2100° C., (b) a shaped body obtained by hot pressing under a pressure of at least 100 kg/cm$^2$ at a temperature of from 1600° to 2100° C. or (c) a single crystal prepared by e.g. a floating zone method, to obtain a shaped product, and processing the forward tip of the shaped product by mechanical polishing or electropolishing to bring the radius of curvature of the tip to a level of from 1 to 2 $\mu$m. Alternatively, a shaped product of a metal having a high melting point such as W, Ta or Mo, already polished to have a radius of curvature of the tip being from 1 to 2 $\mu$m, may be coated with a thin layer of a carbide or boride of at least one element selected from the group consisting of Cr, Mo and W by a CVD method or a molten salt electrolytic method or a plasma flame spraying method.

In addition to the above materials, a shaped product made of $ZrB_{12}$, $UB_{12}$, boron carbide or silicon boride, or a composite of boron carbide and silicon boride, is suitable as the material for the needle-like electrode, since such a material is hardly reactive and readily wettable with various alloys such as Au-Si-Be, Pd-Ni-Si-Be-B or Pt-B. Particularly, a single crystal of $ZrB_{12}$ or $UB_{12}$ prepared by a floating zone method has excellent wettability with various liquid metals and is superior in the stability of the charged particles emission.

The reservoir 2 may be prepared from a readily processable metal such as tantalum, by bend processing and, if necessary, welding of the joint seam portion by e.g. an electron beam. Otherwise, it may be prepared by processing a sintered product of a boride, carbide or nitride (such as WC, TaC, $CrB_2$ or TiN) of e.g. titanium (Ti), zirconium (Zr), niobium (Nb), tantalum (Ta), chromium (Cr), tungsten (W) or molybdenum (Mo) by ultrasonic processing or electro arc machining.

The reservoir 2 may be in any shape so long as it is capable of storing the metal to be ionized and capable of supplying the metal to the needle-like electrode 3. For instance, it may have a shape with its two sides opened, so long as the liquid metal can be maintained in the reservoir 2 by the surface tension of the liquid metal. The needle-like electrode 3 is inserted to the reservoir 2, and the base portion 5 of the needle-like electrode 3 is held by heat-generating support members 7a and 7b. Partitions 9a and 9b are provided at the base portion of the needle-like electrode.

The partitions 9a and 9b serve to prevent the heat-generating support members 7a and 7b from being wetted with the liquid metal. The partitions 9a and 9b are preferably made of a material that is conductive and having a wetting contact angle with the liquid metal being at least 90°, such as glassy carbon, pyrolytic graphite or a carbon sheet. The surface must be free from substantial scars or foreign matters which induce wettability. The partitions 9a and 9b are prepared so that they extend beyond the side surfaces of the base portion 5 of the needle-like electrode to prevent spreading of the wetting by the molten metal. The size of the partitions may vary depending upon the structure and the dimension of the charged particle emission source structure, but is usually larger by from 0.1 to 1.0 mm, preferably from 0.2 to 0.5 mm than the side surface of the base portion 5 of the needle-like electrode. If the size difference is less than 0.1 mm, spreading of wetting by the liquid metal can not be prevented. On the other hand, if the size difference exceeds 1.0 mm, the preparation of the partitions will be extremely difficult. The thickness of the partition is preferably from 0.1 to 0.3 mm. If the thickness is less than 0.1 mm, the mechanical strength will be inadequate, and if the thickness exceeds 0.3 mm, the liquid metal deposited on the thick portion of the partition influences the electric resistance. Further, the transfer of the liquid metal to the heat-generating support member can more effectively be prevented by having the periphery of the partition flanged towards the heat- generating support member side. Further, the partitions 9a and 9b may be integrally formed with the heat-generating support members 7a and 7b, respectively, by machining the heat-generating support members. Further, they may be individual parts interposed between the base portion 5 of the needle-like electrode and the heat-generating support members 7a and 7b. The heat-generating support members 7a and 7b are carbon material having a substantial anisotropy with a large electric resistance in the direction for holding the respective parts, and they may be made of pyrolytic graphite or glassy carbon in addition to the carbon material obtained by thermal decomposition of a resin at a high temperature high pressure condition.

The bond portion 6 between the needle-like electrode and the reservoir serves not only to fix the above-mentioned needle-like electrode having poor weldability and the reservoir but also to prevent leakage of the substance to be ionized from the space between the reservoir and the needle-like electrode. Thus, the bond portion must be made of a material having a poor wettability with a liquid metal. As a result of a research on such a material, it has been found to be preferred that powder A of an inorganic compound having a relatively high melting point such as a boride, carbide or nitride of e.g. Mo, Cr, Zr, Ti, Ta or W, powder B of a metal having a relatively low melting point such as Ni, Fe, Co or Pd and colloidal carbon C ("HITASOL", tradename, manufactured by Hitachi Funmatsu Yakin K.K.) are mixed in a weight ratio of A being from 50 to 93%, B being from 38 to 5% and C being from 2 to 45%, and after a further addition of a small amount of water, the mixture was kneaded to obtain a binder, which is then coated on the joint portion, followed by heating at a temperature of about 1500° C. for a few minutes for sintering.

In the above composition, powder A serves to impart heat resistance to the bond portion, and if the amount is less than 50%, the bond portion tends to be softened and undergo a deformation when the charged particle emission source structure is used under heating. On the other hand, if the amount exceeds 93%, strong bondage can not be obtained unless the sintering temperature is raised. If powder B exceeds 38%, the bond portion tends to be softened and undergo a deformation when the structure is used under heating as mentioned above, and if the amount is less than 5%, no sintering will be attained. When colloidal carbon C is mixed with the above-mentioned powders A and B, a paste having a flowability suitable for application to the joint portion can be obtained. Further, by sintering the composition containing this C component, the bond portion will be made hardly wettable with the liquid metal. Namely, when component C is at least 2%, preferably at least 10%, the flowability of the paste can be improved, and the cracking at the time of drying can be prevented. On the other hand, if the amount exceeds 45%, the sintering will be very difficult, the strength of the bond portion will be weak, and peeling will be likely to occur during use.

The conductive support members $8a$ and $8b$ may be made of a heat resistant metal such as tantalum.

Now, the present invention will be described in further detail with reference to Examples. However, it should be understood that the present invention is by no means restricted by these specific Examples.

EXAMPLE 1

A shaped product of $W_2B_5$ was prepared by hot pressing at a temperature of 1900° C. under a pressure of 150 kg/cm² for 30 minutes. The relative density was at least 95%. This shaped product was processed into an angular rod having a cross section of 0.75×0.75 mm and a length of 5.0 mm. The rod was mechanically polished to obtain a needle-like electrode having an apical angle of the conical tip of 30° and a radius of curvature of the tip of 2 µm.

A tantalum plate having a thickness of 0.1 mm was processed into a cubic cup with a length of each side being 2 mm, and a square hole with a length of each side being 0.8 mm was formed, to obtain a reservoir. The needle-like electrode was inserted to the reservoir, and a paste-like binder obtained by mixing TiC powder, Ni powder and colloidal carbon ("HITASOL", tradename, manufactured by Hitachi Funmatsu Yakin K.K.) in a ratio of 60:30:10% by weight and adding water, if necessary, was coated to the space between the hole at the bottom of the reservoir and the needle-like electrode, followed by heating at 1600° C. for 2 minutes for sintering. Further, pyrolytic graphite was processed into a cubic body with a length of each side being 0.75 mm to obtain a heat-generating member. A pyrolytic graphite plate having a thickness of 0.1 mm was used as the partition. A conductive support member was prepared from tantalum. An alloy of $Ni_{40}Pd_{40}B_{20}$ (atomic ratio) was put into the reservoir as a substance to be ionized, and heated at 920° C. under a vacuumed condition of $7\times10^{-7}$ torr, and the extraction of an ion beam was conducted by applying a voltage of $-8$ KV to the extraction electrode 10, whereby an ion beam 11 with a total current of 50 µA was obtained, and constantly operated over a period of 300 hours. The variation in the total current was not higher than 0.5%/hr. After the operation, the ion source structure was disassembled and examined, whereby no deposition of the alloy was observed at the bond portion 6, the partitions $9a$ and $9b$ and the heat-generating support members $7a$ and $7b$. The above-mentioned voltage of the extraction electrode is a voltage based on the potential of the needle-like electrode, and the same applies to the following Examples.

COMPARATIVE EXAMPLE 1

For the purpose of comparison, a liquid metal ion source similar to the above was prepared by using a needle-like electrode made of a hot pressed sintered product of $TiB_2$ (sintering temperature: 2000° C., pressure: 150 kg/cm², sintering time: 30 minutes).

When the temperature of the needle-like electrode reached 1050° C., the emission of an ion beam started. In 20 hours, the liquid metal was completely evaporated. In the case of a needle-like electrode of $TiB_2$, the surface was not uniformly wetted by the liquid metal, whereby an ion beam was not extracted unless the temperature was raised to a high level, and since the temperature was high, the evaporation loss of the liquid metal was substantial.

EXAMPLE 2

A single crystal of $W_2B_5$ was grown by a floating zone method by means of high frequency induction heating under an atmosphere of 15 kg/cm² of argon gas. In a manner similar to Example 1, a liquid metal ion source was prepared which held 10 mg of an alloy composed of Ni, Pd, B and Be (atomic ratio of 30:60:8:2, respectively). When the needle-like electrode temperature was 850° C., an ion current of 100 µA under an extraction voltage of $-5$ KV was obtained constantly over a period of 1000 hours.

EXAMPLE 3

Shaped products of CrC, WC and MoC were prepared by hot pressing at a temperature of 1900° C. under a pressure of 150 kg/cm² for 30 minutes. The relative density of each shaped product was at least 95%. A needle-like electrode was prepared in the same manner as in Example 1, and 10 mg of an alloy of Pt and B (atomic ratio of 72 : 28, respectively) was held in the reservoir. When the needle-like electrode temperature was 900° C., an ion current of 100 µA under an extraction voltage of $=5$ KV was obtained constantly over a period of 500 hours.

EXAMPLE 4

In the liquid metal ion source structure as shown in FIG. 1, partitions $9a$ and $9b$ made of a sheet having a cross section of 1.2×1.2 mm and a thickness of 0.2 mm obtained by processing glassy carbon, were preliminarily bonded to a heat-generating support members (0.75×0.75 ×0.75 mm) made of pyrolytic graphite by a cyanoacrylate-type instantaneous adhesive. The base portion of a needle-like electrode was inserted into the above-mentioned reservoir made of tantalum, and held from both sides by heat-generating support members to which partitions were bonded. In this case, pyrolytic graphite layers are arranged in parallel with the flexing direction. Into the reservoir, an alloy of Pd, Ni and B (atomic ratio of 40:40:20, respectively) was introduced as the substance to be ionized, and an ion beam emission was conducted under a vacuumed condition of $7\times10^{-7}$ torr. A stabilized ion beam was obtained at an extraction voltage of $-3$ KV over a period of 300 hours. The variation in the ion beam was not higher than 0.5%/hr. After the operation, the ion source was disassembled and examined, whereby no deposition of the alloy was observed on the surface of the heat-generating support members $7a$ and $7b$.

COMPARATIVE EXAMPLE 2

Figure 5:
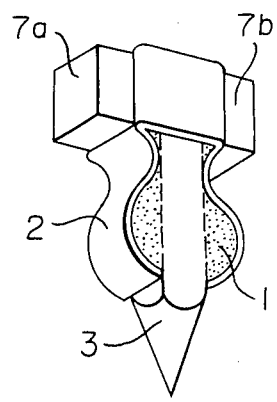

FIG. 5 is a perspective view of the main part of a liquid metal ion source structure of a Comparative Example.

For the purpose of comparison, a liquid metal ion source structure having no partition was prepared as shown in FIG. 5 by using the same needle-like electrode and ionizing substance as used in Example 4, and the ion beam emission test was conducted in the same manner as in Example 4. Five minutes later, the liquid metal creeped to the conductive support members, and the heating was no longer possible.

EXAMPLE 5

A single crystal was prepared from a sintered body of $CrB_2$ by a floating zone method. The single crystal was processed into a square pillar, and its forward tip was sharpened by electropolishing to have a radius of curvature of 1.0 μm, to obtain a needle-like electrode.

A sintered body of WC (relative density: 99%) was processed into a cylindrical rod having a diameter of 3 mm and a height of 2.5 mm. Into this cylindrical rod, a recess having a diameter of 2.0 mm and a depth of 2.0 mm was formed by an ultrasonic processing machine, and a through-hole having a diameter of 0.7 mm was formed at the center of the recess, to obtain a reservoir.

A needle-like electrode was inserted to the reservoir, and a paste-like binder obtained by mixing $W_2B_5$ powder, Co powder and colloidal carbon (same as used in Example 1) in a ratio of 60:20:20% by weight, was coated at the space between the hole at the bottom of the reservoir and the needle-like electrode, and heated at 1550° C. for 3 minutes for sintering. The same heat-(generating support members as used in Example 1 were used. Into the reservoir, a $Au_{60}Si_{26}Be_{14}$ alloy (atomic ratio) was introduced as the substance to be ionized, and the extraction of an ion beam was conducted at an extraction voltage of −6 KV under heating at 600° C. in a vacuumed condition of $1.0 \times 10^{-7}$ torr, whereby a stabilized ion beam having a total current of 10 μA was obtained over a period of about 400 hours.

After the operation, the ion source was disassembled and examined, whereby a deposition of the alloy on the outer side of the reservoir was observed as the reservoir was made of a material wettable with the alloy. However, no creeping of the alloy to the heat-generating support members was observed.

EXAMPLE 6

Figure 3:
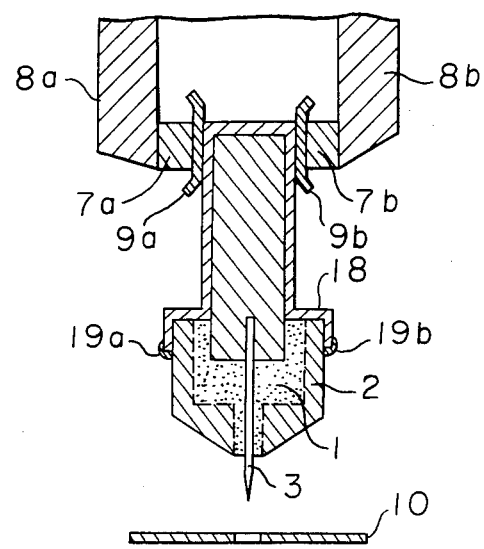

FIG. 3 is a cross sectional view of a liquid metal ion source structure of this Example.

A through-hole having a diameter of 1.0 mm was formed at the center of a cylindrical rod made of tantalum and having a diameter of 3.0 mm and a height of 2 mm, and a hole having a diameter of 2.7 mm was further formed to a depth of 1.5 mm. The angle of one side of this cylindrical rod was rounded off, to obtain a reservoir 2.

Then, a tungsten wire having a diameter of 0.125 mm was spot-welded to an angular rod made of tantalum and having a square cross section of 0.5×0.5 mm and a length of 2.5 mm, and the forward tip of the tungsten wire was processed by electropolishing to have an radius of curvature of 1 μm, to obtain a needle-like electrode 3.

A tantalum sheet strip 18 having a thickness of 0.1 mm, a width of 0.5 mm and a length of 9 mm was employed to secure the reservoir and the needle-like electrode. Both ends of the strip were spot-welded to the joint portions 19a and 19b with the reservoir. A needle-like electrode was inserted to the reservoir thus provided with the strip. Partitions 9a and 9b are sheets of glassy carbon having a size of 1.2×1.2×0.2 mm with their periphery flanged or bent towards one side. They were attached with their flanged portion located at the heat-generating support member side.

The heat-generating support members 7a and 7b were prepared from pyrolytic graphite by processing it into a cubic body with a length of each side being 0.75 mm.

Into the reservoir, a $Au_{60}Si_{26}Be_{14}$ alloy (atomic ratio) was introduced, and the extraction of an ion beam was conducted at an extraction voltage of −4 KV by heating the needle-like electrode at 700° C. under a vacuumed condition of $1 \times 10^{-7}$ torr. As the result, an ion beam having a total current of 10 μA was obtained over a period of 500 hours, whereby the variation in the current was not higher than 1%/hr. Then, the ion source structure was disassembled and examined, whereby no deposition of the alloy at the heat-generating support members and the partitions.

EXAMPLE 7

Figure 4:
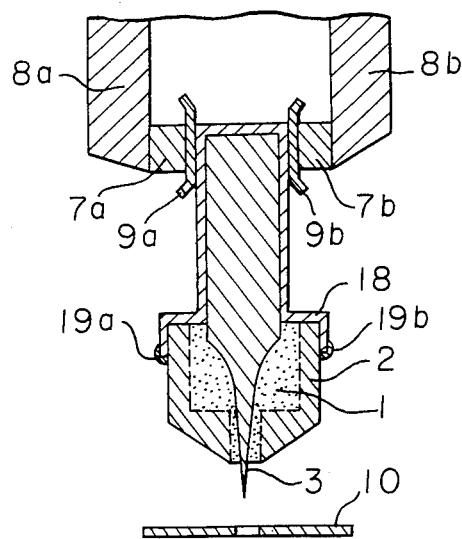

FIG. 4 is a cross sectional view of a liquid metal ion source structure of this Example.

Firstly, the same reservoir 2 as in Example 6 was prepared. Then, tungsten carbide was processed into a parallelepiped having a square cross section of 0.5×0.5 mm and a length of 5.0 mm by electro arc machining, and then the forward tip was sharpened by mechanical polishing to have a radius of curvature of 0.5 μm, to obtain a needle-like electrode 3.

Then, the same strip, partitions and heat-generating support members as in Example 6 were prepared, and assembled in the same manner as in Example 6.

The same alloy as used in Example 6 was introduced into the reservoir, and the extraction of an ion beam was conducted under the same conditions as in Example 6. As the result, an ion beam having a total current of 30 μA was obtained over a period of 400 hours, whereby the variation in the current was not higher than 1%/hr. Then, the ion source structure was disassembled and examined, whereby no deposition of the alloy was observed at the heat-generating support members and at the partitions.

EXAMPLE 8

Firstly, a field emission electron source structure having a tungsten needle-like electrode made of the same material and having the same structure as in Example 6, was prepared. Then, the needle-like electrode and a part of the reservoir were dipped in liquid gallium heated and melted at a temperature of 600° C. under a vacuumed condition of not higher than $1 \times 10^{-6}$ torr to wet the surface of the needle-like electrode and to impregnate the interior of the reservoir.

Then, the temperature of the needle-like electrode was lowered to 100° C., and the extraction of an electron beam was conducted at an extraction voltage of +4 KV under a vacuumed condition of not higher than $1 \times 10^{-8}$ torr. As the result, an electron beam having a total current of 5 μA was obtained over a period of 1000 hours, whereby the variation in the current was not higher than 1%/hr.

EXAMPLE 9

Firstly, a field emission electron source structure having a tungsten carbide needle-like electrode made of the same material and having the same structure as in Example 7 was prepared. Then, the needle-like electrode and a part of the reservoir were dipped in liquid strontium heated and melted at a temperature of 900° C. under a vacuumed condition of not higher than $1\times10^{-7}$ torr, to wet the surface of the needle-like electrode and to impregnate the interior of the reservoir.

While maintaining the above temperature, the extracton of an electron beam was conducted by applying a voltage of +6.5 KV to the extraction electrode under a vacuumed condition of not higher than $1\times10^{-9}$ torr. When the total current was stabilized at a level of 10 μA, the needle-like electrode temperature was lowered to room temperature while continuously applying the voltage to the extraction electrode. The extraction of an electron beam was continued at an extraction electrode voltage of +6.3 KV while maintaining the above-mentioned vacuumed condition, whereby an electron beam having a total current of 3 μA was obtained over a period of 1000 hours, whereby the variation in the current was not higher than 1%/hr. EXAMPLE 10

Firstly, a thermal field emission electron source structure having a tungsten carbide needle-like electrode made of the same material and having the same structure as in Example 7, was prepared. Then, the needle-like electrode and a part of the reservoir were dipped in liquid cerium heated and melted at a temperature of 900° C. under a vacuumed condition of not higher than $1\times10^{-7}$ torr, to wet the surface of the needle-like electrode and to impregnate the interior of the reservoir.

While maintaining the above temperature, the extraction of an electron beam was conducted by applying a voltage of +6.5 KV to the extraction electrode under a vacuumed condition of not higher than $1\times10^{-8}$ torr. As the result, an electron beam having a total current of 10 μA was obtained over a period of 1000 hours, whereby the variation in the current was not higher than 1%/hr.

EXAMPLE 11

A sintered body was prepared with the composition and under the hot pressing conditions as shown in Table 1. The relative density of each sintered product was at least 90%. Each sintered product was cut into a size of 0.5×0.5×3 mm, and then the forward tip thereof was mechanically polished to have an apical angle of the conical tip of 30° and a radius of curvature of the tip of 2 μm, to obtain a needle-like electrode.

TABLE 1

|  | Test No. | | | | |
| --- | --- | --- | --- | --- | --- |
|  | 1 | 2 | 3 | 4 | 5 |
| Composition (%) | | | | | |
| B₄C | 100 | 75 | 50 | 25 | 0 |
| SiB₆ | 0 | 25 | 50 | 75 | 100 |
| Hot-pressing conditions | | | | | |
| Temperature (°C.) | 2100 | 2050 | 1900 | 1850 | 1800 |
| Pressure (kg/cm²) | 150 | 150 | 150 | 100 | 100 |
| Time (hr) | 1 | 1 | 0.5 | 0.5 | 0.5 |

By using such a needle-like electrode, a liquid metal ion source structure having the same structure as in Example 1, was prepared.

Aluminum was melted in a boron nitride crucible under a vacuumed condition of $1\times10^{-6}$ torr. While heating the needle-like electrode, it was dipped in the molten aluminum and 10 mg was pooled between the needle-like electrode and the reservoir. The needle-like electrode of the liquid metal ion source thus obtained, was heated to a temperature of 700° C., and the extraction of an ion beam was conducted, whereby an ion beam having a total current of 100 μA at an extraction voltage of −4 KV was stable over a period of 300 hours.

EXAMPLE 12

With each of the needle-like electrodes prepared in Example 11, a liquid metal ion source holding 10 mg of an alloy comprising Ni, Pd, B and Be (atomic raito of 30:60:8:2, respectively) was prepared. An ion beam of 100 μA at an extraction voltage of −5 KV was stable for 1000 hours at an needle-like electrode temperature of 850° C.

EXAMPLE 13

With each of the needle-like electrodes prepared in Example 11, a liquid metal ion source holding 10 mg of an alloy comprising Pt and As (atomic ratio of 70:30, respectively) was prepared. An ion beam of 50 μA at an extraction voltage of −7 KV was stable for 200 hours at the needle-like electrode temperature of 800° C.

We claim:

1. A charged particle emission source structure comprising a needle-like electrode for emission of charged particles, a reservoir for a liquid metal for wetting the surface of the needle-like electrode, heat-generating support members for heating the liquid metal and holding the reservoir or the needle-like electrode, and an extraction electrode for applying an electric field as between it and the needle-like electrode, which is characterized in that conductive partitions hardly wettable with the liquid metal are provided between the heat-generating support members and the reservoir or the needle-like electrode, wherein the reservoir and the needle-like electrode are bonded by a material hardly wettable with the liquid metal, and the base portion of the needle-like electrode is held by the heat-generating support members with the partitions interposed between the base portion and the heat-generating support member.

2. A charged particle emision source structure comprising a needle-like electrode for emission of charged particles, a reservoir for a liquid metal for wetting the surface of the needle-like electrode, heat-generating support members for heating the liquid metal and holding the reservoir or the needle-like electrode, and an extraction electrode for applying an electric field as between it and the needle-like electrode, which is characterized in that conductive partitions hardly wettable with the liquid metal are provided between the heat-generating support members and the reservoir or the needle-like electrode, wherein the partitions are plates having a surface area larger than the surface area for contact with the heat-generating support members.

3. A charged particle emission source structure comprising a needle-like electrode for emission of charged particles, a reservoir for a liquid metal for wetting the surface of the needle-like electrode, a heat-generating support member for heating the liquid metal and holding the reservoir or the needle-like electrode, and an extraction electrode for applying an electric field as between it and the needle-like electrode, which is characterized in that conductive partitions hardly wettable with the liquid metal are provided between the heat-generating support members and the reservoir or the needle-like electrode, wherein the partitions are plates with periphery flanged towards the heat-generating support members side.

4. The charged particle emission source structure according to claims 1, 2 or 3 wherein a heat resistant metal strip is bonded to the reservoir, and the base portion of the needle-like electrode is held by the heat-generating support members with the metal strip and the partition interposed between the base portion and the heat-generating support members.

5. The charged particle emission source structure according to claims 1, 2 or 3 wherein the needle-like electrode is a shaped product made of a carbide or boride of at least one element selected from the group consisting of chromium, molybdenum and tungsten.

6. The charged particle emission source structure according to claims 1, 2 or 3 wherein the needle-like electrode is a shaped product made of $ZrB_{12}$ or $UB_{12}$.

7. The charged particle emission source structure according to claims 1, 2 or 3 wherein the needle-like electrode is made of a single crystal of $ZrB_{12}$ or $UB_{12}$.

8. The charged particle emission source structure according to claims 1, 2 or 3 wherein the needle-like electrode is a shaped product made of boron carbide or silicon boride or a combination thereof.

9. The charged particle emission source structure according to claims 1, 2 or 3 wherein the needle-like electrode is a shaped product obtained by hot pressing tungsten boride at a temperature of from 1600° to 2100° C. under a pressure of at least 100 kg/cm$^2$.

10. The charged particle emission source structure according to claims 1, 2 or 3 wherein the needle-like electrode is a shaped product obtained by processing a single crystal of $W_2B_5$ or WB.

11. The charged particle emission source structure according to claims 1, 2 or 3 wherein the liquid metal is a boron-containing alloy, and the needle-like electrode is a shaped product made of a carbide or boride of at least one element selected from the group consisting of chromium, molybdenum and tungsten.

12. The charged particle emission source structure according to claims 1, 2 or 3 wherein the hardly wettable material is obtained by sintering a mixture comprising an inorganic compound having a relatively high melting point, a metal having a relatively low melting point and colloidal carbon.

13. The charged particle emission source structure according to claim 12, wherein the inorganic compound having a relatively high melting point is a boride, carbide or nitride of at least one element selected from the group consisting of Mo, Cr, Zr, Ti, Ta and W, and the metal having a relatively low melting point is at least one metal selected from the group consisting of Ni, Fe, Co and Pd.

14. The charged particle emission source structure according to claims 1, 2 or 3 wherein the hardly wettable material is obtained by kneading TiC powder, Ni powder and colloidal carbon together with water, followed by heating and sintering.

15. The charged particle emission source structure according to claims 1, 2 or 3 wherein the partitions are made of carbon material.

16. The charged particle emission source structure according to claims 1, 2 or 3 wherein the partitions are made of glassy carbon.

17. The charged particle emission source structure according to claims 1 or 3, wherein the partition is a plate having a surface area larger than the surface area for contact with the respective heat-generating support member.

18. The charged particle emission source structure according to claims 1 or 2, wherein each partition is a plate with its periphery flanged towards the respective heat-generating support member side.

19. The charged particle emission source structure according to claims 1, 2 or 3 wherein the charged particles are field emission electrons or thermal field emission electrons.

20. The charged particle emission source structure according to claims 1, 2 or 3 wherein the charged particles are field emission ions.

* * * * *

UNITED STATES PATENT AND TRADEMARK OFFICE
CERTIFICATE OF CORRECTION

PATENT NO. : 4,721,878
DATED : January 26, 1988
INVENTOR(S) : Hirotoshi Hagiwara et al It is certified that error appears in the above-identified patent and that said Letters Patent is hereby corrected as shown below:

| Col. | Line | |
|---|---|---|
| 1 | 28 & 32, | delete "hair pin" and insert --hairpin--. |
| 3 | 18, | delete "DESCRIPTION OF THE INVENTION" and insert --BRIEF DESCRIPTION OF THE DRAWINGS--. |
| | 35, | delete "BRIEF DESCRIPTION OF THE DRAWINGS" and insert --DETAILED DESCRIPTION OF THE INVENTION--. |
| 4 | 41, | delete "30°C., an" and insert --30° C.; an--, |
| | 64, | delete "on" and insert --one--. |
| 5 | 15, | delete "stoichiometry" and insert --stoichiometric--. |
| 6 | 17, | delete "can not" and insert --cannot--. |
| 7 | 2, | delete "can not" and insert --cannot--. |
| 8 | 42, | delete "of =5KV" and insert --of -5KV--, |
| | 50, | delete "a". |
| 9 | 35, | delete "(generating" and insert --generating--. |
| 10 | 13, | delete "$AU_{60}Si_{26}Be_{14}$" and insert --$Au_{60}Si_{26}Be_{14}$--, |
| | 47, | delete line and insert --the partitions.  EXAMPLE 8--. |
| 11 | 8 & 9, | delete "extracton" and insert --extraction--, |
| | 21, | delete line and insert --rent was not higher than 1%/hr.  EXAMPLE 10--. |

UNITED STATES PATENT AND TRADEMARK OFFICE
CERTIFICATE OF CORRECTION

PATENT NO. : 4,721,878

DATED : January 26, 1988

INVENTOR(S) : Hirotoshi Hagiwara et al

It is certified that error appears in the above-identified patent and that said Letters Patent is hereby corrected as shown below:

<u>Col.</u>   <u>Line</u>

12   10,   delete "raito" and insert --ratio--, 13,   delete "an" and insert --a--, 44,   delete "emision" and insert --emission--.

13   4 & 5,  delete "members" and insert --member's--.

14   27,   delete "the" and insert --each--.

Signed and Sealed this

Twenty-first Day of February, 1989

Attest:

DONALD J. QUIGG

*Attesting Officer*   *Commissioner of Patents and Trademarks*